United States Patent
Vinciarelli et al.

[11] Patent Number: 6,138,349
[45] Date of Patent: Oct. 31, 2000

[54] PROTECTIVE COATING FOR AN ELECTRONIC DEVICE

[75] Inventors: Patrizio Vinciarelli, Boston; Jeffrey A. Curhan, Medway, both of Mass.

[73] Assignee: VLT Corporation, San Antonio, Tex.

[21] Appl. No.: 08/993,503

[22] Filed: Dec. 18, 1997

[51] Int. Cl.[7] .................................................. H05K 3/30
[52] U.S. Cl. .............................. 29/841; 29/842; 29/843; 428/76; 427/96; 427/154; 216/43
[58] Field of Search ........................... 29/841, 840, 850, 29/855, 832; 257/578, 499, 501; 428/76, 201, 203; 427/154, 155, 96; 216/41, 43, 45, 51

[56] References Cited

U.S. PATENT DOCUMENTS

| | | |
|---|---|---|
| 4,158,190 | 6/1979 | Stefanov . |
| 4,321,589 | 3/1982 | King . |
| 4,759,069 | 7/1988 | Bernstein et al. . |
| 4,785,474 | 11/1988 | Bernstein et al. . |
| 4,888,226 | 12/1989 | Wong ........................................ 428/76 |
| 4,956,866 | 9/1990 | Bernstein et al. . |
| 5,041,976 | 8/1991 | Marko et al. . |
| 5,060,279 | 10/1991 | Crawford et al. . |
| 5,193,513 | 3/1993 | Marko et al. . |
| 5,213,864 | 5/1993 | Wong ........................................ 428/76 |
| 5,235,329 | 8/1993 | Jackson . |
| 5,274,913 | 1/1994 | Grebe et al. .............................. 29/840 |
| 5,275,841 | 1/1994 | Wong ........................................ 427/96 |
| 5,287,411 | 2/1994 | Hill et al. . |
| 5,307,060 | 4/1994 | Prevulsky et al. . |
| 5,365,403 | 11/1994 | Vinciarelli et al. ...................... 361/707 |
| 5,422,543 | 6/1995 | Weinberg . |
| 5,483,936 | 1/1996 | Kerstein et al. . |
| 5,526,234 | 6/1996 | Vinciarelli et al. ...................... 361/740 |
| 5,559,508 | 9/1996 | Orr et al. . |
| 5,568,684 | 10/1996 | Wong ........................................ 29/840 |
| 5,644,103 | 7/1997 | Pullen et al. ............................. 174/52.1 |
| 5,663,869 | 9/1997 | Vinciarelli et al. ...................... 361/707 |
| 5,710,555 | 1/1998 | McConnell et al. . |

FOREIGN PATENT DOCUMENTS

| | | |
|---|---|---|
| 0 601 323 A1 | 6/1994 | European Pat. Off. . |
| WO 97/15951 | 5/1997 | WIPO . |

OTHER PUBLICATIONS

"Parylene, and NOVA TRAN® World–Class Parylene Coating Services," product brochure, Specialty Coating Systems/Alpha Metals, Inc., 1995.

"Parylene Conformal Coatings Specifications and Properties," product brochure, Specialty Coating Systems/Alpha Metals, Inc., 1997.

ERI—1 Test Procedure.

The Alarming Sounds of Silence, Jan. 1994, Ergonomics in Design.

Emergency Vehicle Warning Systems, NBS Special Publication 480–37, U. S. Department of Commerce, National Bureau of Standards.

EARS Systems, Inc.

Field Tests of an Automotive Siren/Horn Detector.

Toward Emergency Vehicle Detection: Systemic Considerations, Harkins, Jensema, & Ryland, Callaudet Research Institute, Wash. D.C.

*Primary Examiner*—Valencia Martin-Wallace
*Assistant Examiner*—Binh-An Nguyen
*Attorney, Agent, or Firm*—Fish & Richardson P.C.

[57] ABSTRACT

A method for forming a protective coating on an exposed surface of an electronic device, including forming the protective coating on a conductive termination connected to a circuit element in the electronic device, and making a window in the protective coating to expose the termination.

32 Claims, 9 Drawing Sheets

PROTECTIVE COATING FOR AN ELECTRONIC DEVICE

BACKGROUND OF THE INVENTION

This invention relates to a protective coating for an electronic device.

Referring to FIG. 1, a power device 90, for example, may be mounted on a baseplate 92 and attached to a printed circuit board (PCB) 94 (see U.S. Pat. No. 5,526,234, incorporated by reference). Power device 90 has a semiconductor 96 mounted on an electrically nonconductive substrate 98, and conductive pads 100, which are electrically connected to semiconductor 96 by bond wires 102. PCB 94 has a conductive run 108 on the top surface that is connected by a through hole 106 to the bottom surface. Electrical connection between the bottom surface of through hole 106 and a conductive pad 100 is made by solder 110. The amount of solder 110 that contacts conductive pad 100 and the area of solder bond are variable.

An electronic device often needs to be protected from the environment. One method for protecting an electronic device involves covering part of the device with a silicone gel (see U.S. Pat. No. 4,888,226). When the silicone gel is initially applied, it has a viscous constituency which is capable of flowing about the components on the electronic device so as to encase them. The gel is then hardened by curing.

SUMMARY OF THE INVENTION

In general, in one aspect, the invention features forming a protective coating on an exposed surface of an electronic device, including forming the protective coating on a conductive termination connected to a circuit element in the electronic device, and making a window in the protective coating to expose the termination.

Embodiments of the invention may include one or more of the following features. The protective coating may be uniform in thickness and conform to the geometric configuration of the electronic device. Vapor deposition may be used to deposit a polymer, such as poly-para-xylylene (trade name: "parylene"), on the surface of the electronic device. The electronic device may be an integrated power device (IPD), and the circuit element may be a semiconductor or a power semiconductor.

The window in the protective coating may be made by laser cutting the coating in a predetermined pattern, which may include a pattern of parallel strokes for removing strips of the coating or a perimeter cut to outline the area of the coating to be removed. The laser may be a stroke marking laser or a mask marking laser or a fixed beam laser. In implementations of the invention, the outlined area of the protective coating is peeled away from the surface of the electronic device by passing compressed air or an inert gas over the surface of the coating until the coating dislodges from the electronic device.

Solder may be applied to the portion of the conductive termination exposed by the window in the protective coating using reflow soldering. The electronic device may be encapsulated in a potting material, which may include a silicone resin or polyurea.

In general, in another aspect, the invention features forming a protective coating of poly-para-xylylene on an exposed surface of an integrated power device, including forming the protective coating on a conductive termination connected to a semiconductor in the power device, and cutting a window in the protective coating using a laser to expose the termination.

In general, in another aspect, the invention features forming a protective coating on an exposed surface of an electronic device, including forming the protective coating on a conductive termination connected to a circuit element in the electronic device, making a window in the protective coating to expose the termination, applying solder to the portion of the conductive termination exposed by the window in the protective coating, and encapsulating the electronic device in a potting material.

In general, in another aspect, the invention features a method for use with an electronic device having a conductive termination pad and an electronic component connected to the pad. The method includes applying a protective coating to surfaces of the termination pad and the electronic component, cutting a window in the protective coating to expose the termination pad, and flowing solder into the window to make electrical connection between the solder pad and a circuit.

In general, in another aspect, the invention features a circuit board, an electronic device, and solder connecting the two together. The electronic device has a substrate, a conductive termination pad formed on the substrate, an electronic component mounted on the substrate and connected to the termination pad, a protective coating on the pad and the electronic component, and a window formed in the protective coating to expose the conductive termination pad. Solder connects the termination pad to the circuit board via the window.

In general, in another aspect, the invention features an electronic device, a protective, conformal coating on the surface of the electronic device containing conductive terminations, and a window in the protective coating to expose the conductive terminations.

Advantages of the invention includes one or more of the following. The protective poly-para-xylylene ("parylene") coating on the power device provides a barrier to environmental influences while allowing the conductive pads on the power device to make electrical connections with other electronic devices through windows in the protective coating. The uniformity of the parylene coating facilitates the design of a laser pattern for ablating a window in the coating. A laser cut window in the parylene coating precisely defines the size and shape of the solder bond between the power device and the PCB.

The parylene coating protects the power device from the external environment, provides a dielectric benefit, and increases the mechanical integrity of the bond wires. Vapor deposition of parylene produces a uniform, conformal coating over the entire exposed surface of the power device. The coating is uniform in thickness and conforms to the geometric configuration of the power device. This application process can be repeated precisely, producing multiple power devices with a parylene coating of specific thickness. A parylene coating of 8–12 microns adds little volume to the size of the power device and thus facilitates high density packaging of the power device with other components. Parylene has optical clarity allowing for visible inspection of the power device prior to packaging.

Other advantages and features will become apparent from the following description and from the claims.

DESCRIPTION

Figure 1:
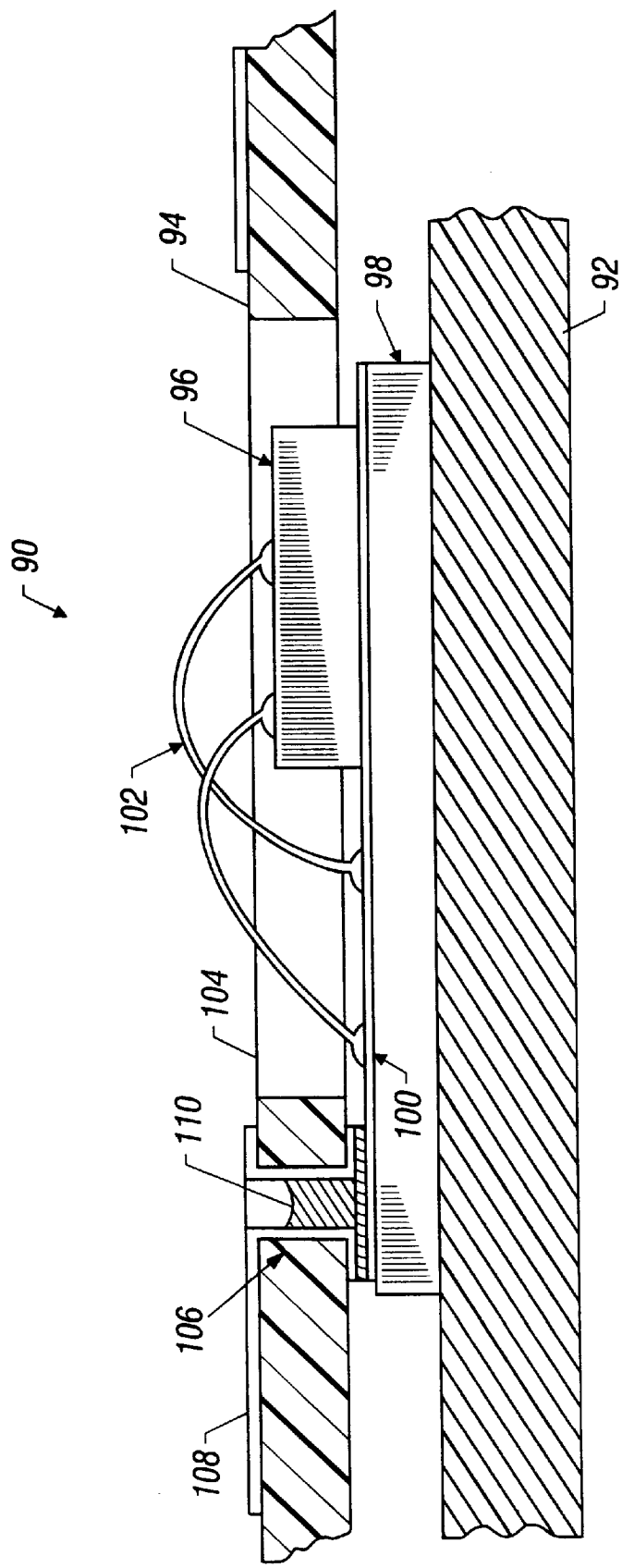
FIG. 1 is an enlarged cross-sectional side view of a prior art mounting of a power device.
Figure 2:
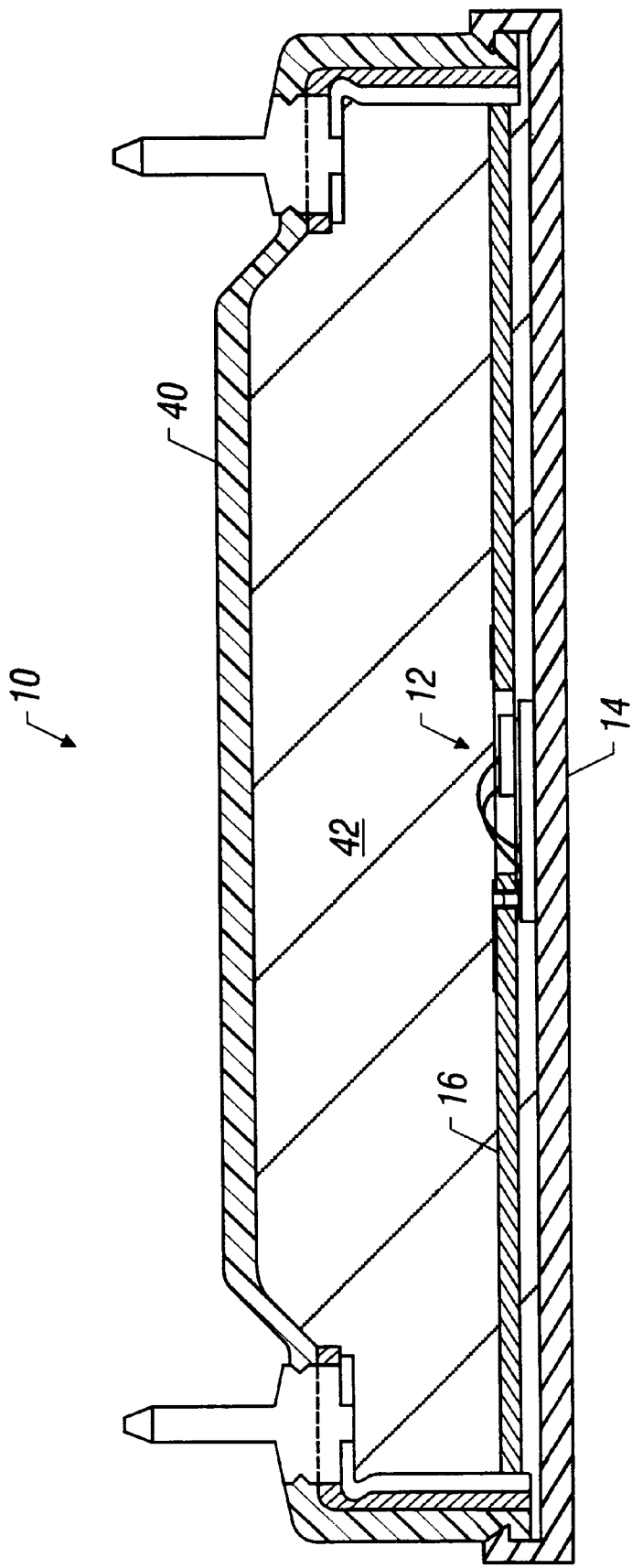
FIG. 2 is a side-sectional view of a packaged integrated power device according to the invention.

Referring to FIG. 2, in a packaged circuit 10, an integrated power device (IPD) 12 is attached directly to both a heat-sinking metal baseplate 14 and to a printed circuit board (PCB) 16. A case 40 attaches to baseplate 14, enclosing power device 12 and PCB 16. The space enclosed within case 40 is filled with an encapsulant 42, which protects IPD 12. Additional details of the general packaging scheme are described in U.S. Pat. Nos. 5,526,234, 5,644,103, and 5,663,869, and patent application Ser. No. 08/851,482, incorporated by reference.

Figure 3:
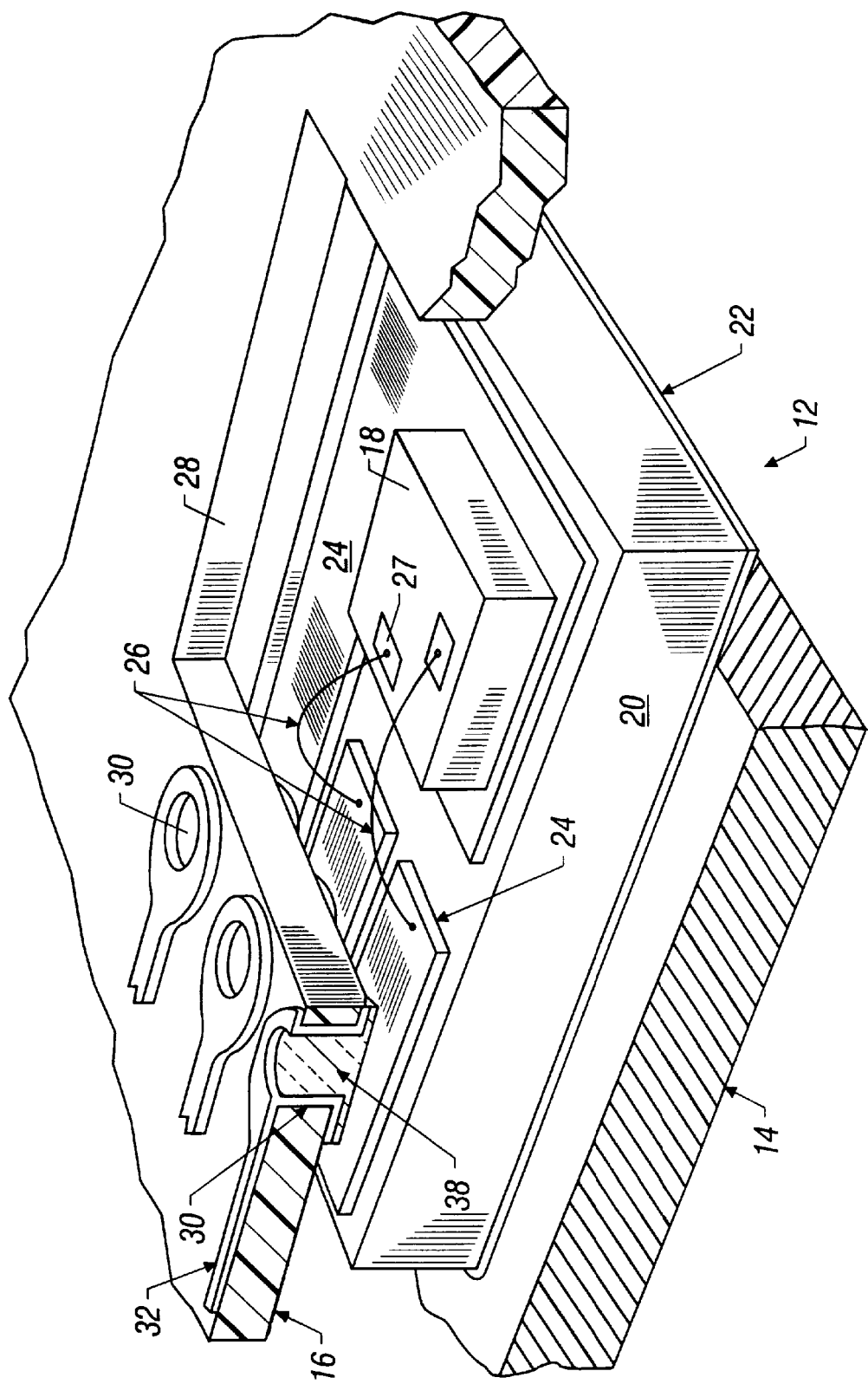
FIG. 3 is an enlarged perspective view, partially broken away, of the mounting arrangement of the power device.

Referring to FIG. 3, IPD 12 has a semiconductor 18 mounted on an insulating substrate 20, which is attached to baseplate 14 (using, for example, solder or a thermally conductive adhesive 22). Substrate 20 also bears conductive pads 24 which may be electrically connected by metal wires 26 to terminals 27 on the top of semiconductor 18. In some applications, the semiconductor 18 is mounted onto one of the conductive pads 24 (as shown in FIG. 3) to provide an electrical connection to the back of the die or to improve thermal performance, or both. In general, an IPD comprises one or more power semiconductors and may also contain one or more control semiconductor devices. In some applications the semiconductors are mounted to an assembly comprising a substrate 20 and conductive pads 24; in other applications no substrate 20 is used and the IPD comprises a power semiconductor mounted directly to a conductive element (e.g., pad 24). The insulating substrate may comprise, for example, a ceramic or printed circuit board material.

PCB 16 has an aperture 28 which accommodates the semiconductor 18 and metal wires 26. Smaller through holes 30 connect conductive runs 32 on the top surface of PCB 16 to the bottom surface of PCB 16. Each of the conductive pads 24 has a corresponding through hole 30. A conductive run 32 is electrically connected to a conductive pad 24 by solder 38 in a through hole 30.

Figure 4:
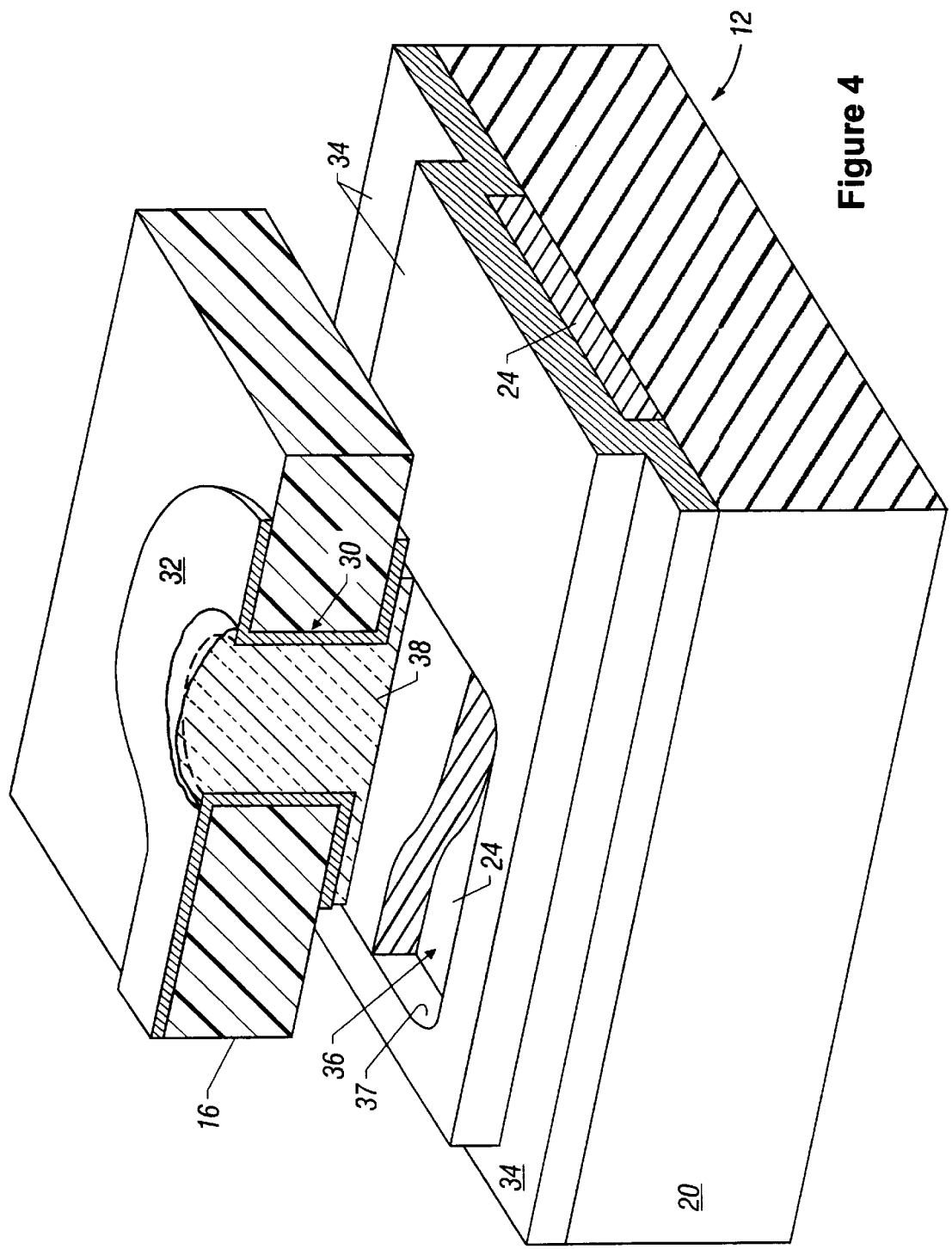
FIG. 4 is an even more enlarged perspective view, partially broken away, of the mounting arrangement (not to scale).

Referring also to FIG. 4, a protective coating of parylene 34 covers the surface of power device 12 that, as shown in FIG. 3, contains semiconductor 18, metal wires 26, and conductive pads 24. A rectangular window 36 defined by vertical walls 37 cut into the parylene 34 exposes the top surface of conductive pad 24. Solder 38 fills the window and through hole 30 to form a mechanical and electrical connection between the exposed portion of conductive pad 24 and conductive run 32. The window 36 limits the region of the pad to which solder can adhere and prevents solder from adhering to a broader, undefined area of the surface of the conductive pad. Any solder which might flow away from the area of the window will be prevented by the parylene from adhering to the pad, die or wire bond connections. This method of connecting power device 12 to PCB 16 allows the precise area of the solder bond to be defined by the size and shape of the window in the parylene 34.

Figure 5:
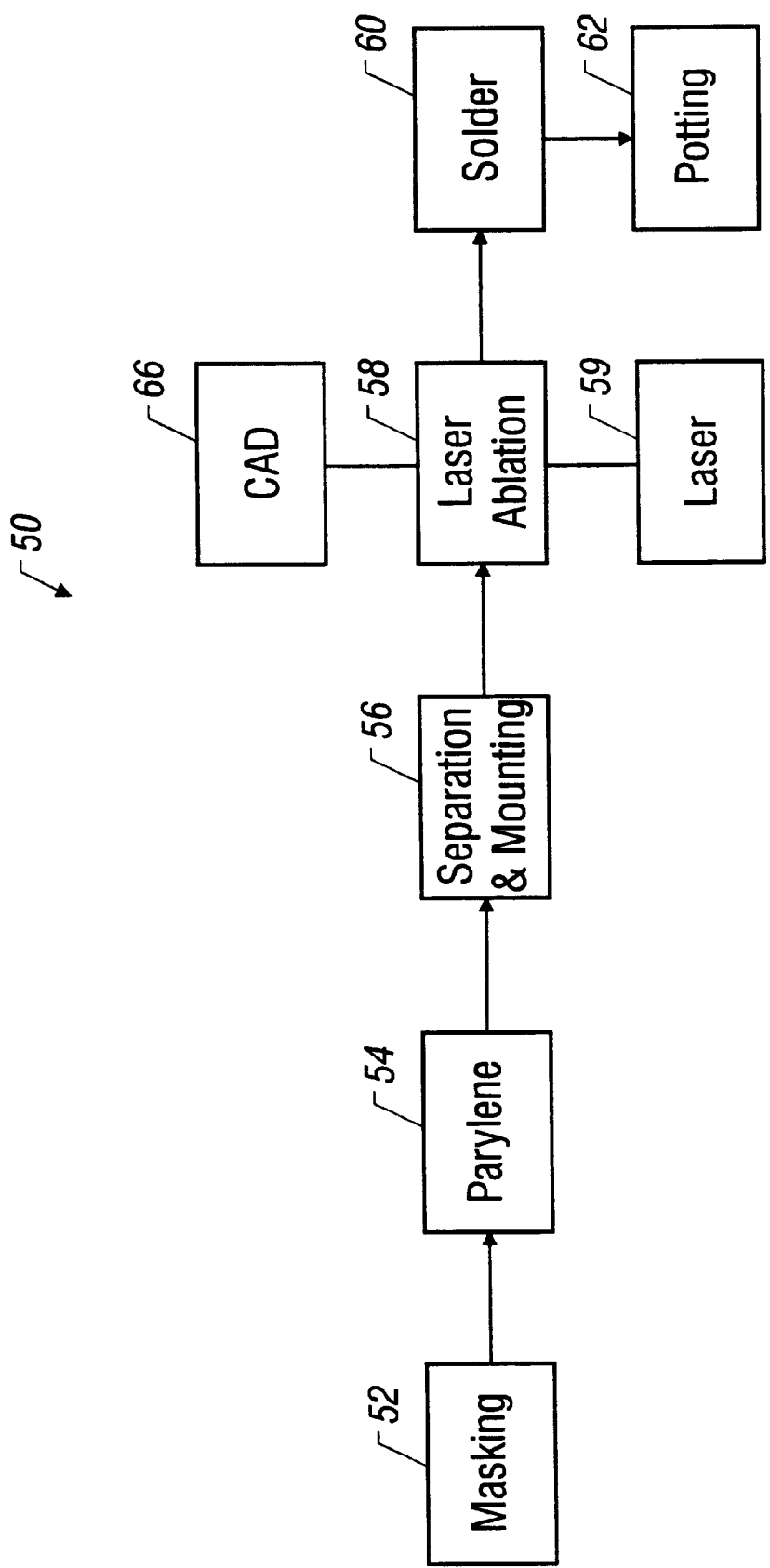
FIG. 5 is a block diagram of an integrated power device packaging line.

Referring to FIG. 5, an integrated power device packaging line, 50 has a masking station 52, a parylene coating station 54, a separation and mounting station 56, a laser ablation station 58, a solder station 60, and a potting station 62.

Figure 6:
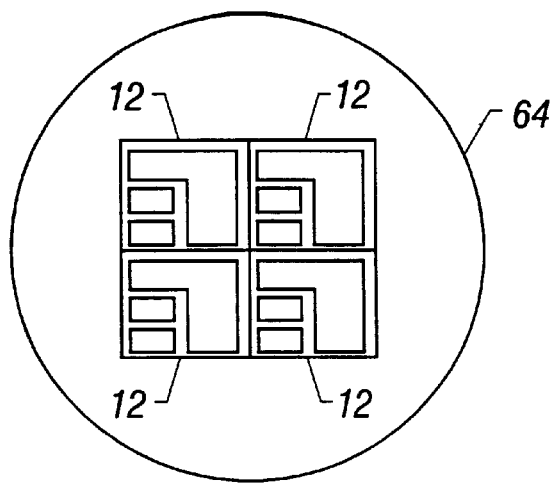
FIG. 6 is a top view of an adhesive sheet with power devices attached.

Referring also to FIG. 6, at masking station 52, an array of power devices 12 are secured to an adhesive sheet 64 (e.g., Nitto Wafer Tape) with the surface of power device 12 that contains semiconductor 18, metal wires 26, and conductive pads 24 left exposed.

Adhesive sheet 64 containing power devices 12 is then transferred to parylene coating station 54 where the protective parylene coating 34 is vapor deposited on the exposed surface in a vapor deposition chamber (Specialty Coating Systems, Inc., Indianapolis, Ind.). Vapor deposition produces a uniform, conformal protective parylene coating 34 over the entire exposed surface of power device 12. The parylene coating 34 is uniform in thickness (8–12 microns) and conforms to the geometric configuration of power device 12 by adhering to all exposed surfaces, including the metal wires 26. This coating protects power device 12 from environmental influences, such as moisture and sulfur. In addition, parylene coating 34 provides a dielectric insulating benefit and adds to the mechanical integrity of the metal wires 26. An advantage associated with applying the parylene coating after the power devices are mounted to the adhesive sheet is that the surfaces of the power devices which are in contact with the sheet will not be coated with parylene. This provides a "clean" surface on the power devices for subsequent mounting to the baseplate. In separation and mounting station 56, each of the coated power devices 12 is separated from adhesive sheet 64 and mounted to a metal baseplate 14 (see U.S. Pat. No. 5,526,234, incorporated by reference).

Figure 7:
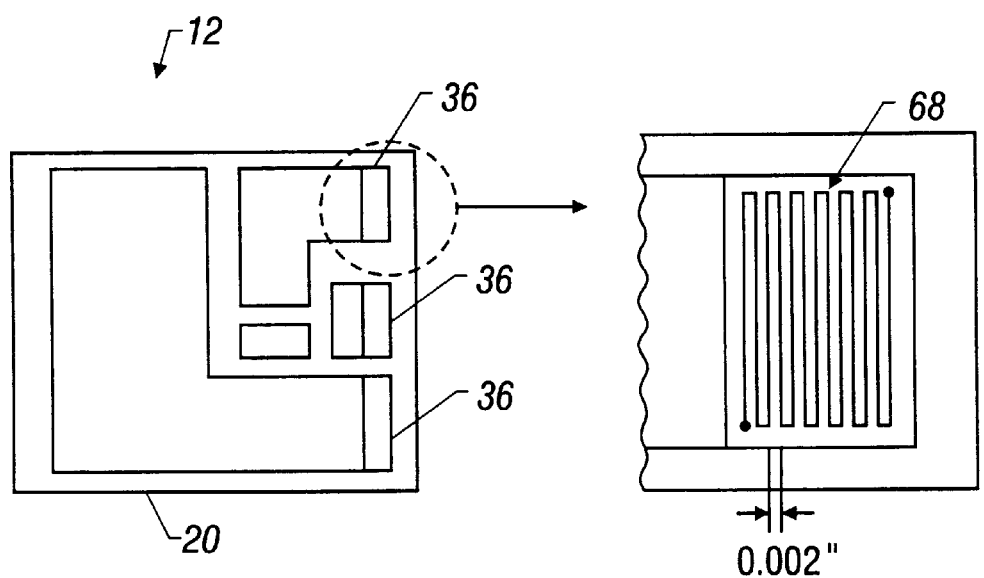
FIG. 7 is a top view of a coated integrated power device with an enlarged view of a laser pattern.

Referring to FIG. 7, laser ablation station 58 cuts window 36 in the protective parylene coating 34 on coated power device 12 to expose conductive pads 24. Laser ablation station 58 includes a stroke marking laser 59 (e.g., Nd:YAG-laser, manufactured by A-B Lasers, Acton, Mass.) and a CAD station 66 for designing a laser pattern. A stroke marking laser positions the laser beam with galvanometer activated mirrors prior to passing the beam through the final focusing lens. To ablate a window in parylene coating 34 of nominal 8–12 micron ($10^{-6}$ meter) thickness the laser may be set for two passes at a galvo speed of 500 mm/s, a Q-switch pulse rate of 7.5 Khz and a lamp power of 18 Amperes. Laser pattern 68, with a line spacing of 0.002 inches in the fill pattern, illustrates the predetermined pattern of parallel strokes that laser 59 makes during each pass. An advantage of using a stroke marking laser is that, since power device 12 remains stationary while the laser ablates a pattern on the parylene coating 34, the laser beam can be positioned and moved rapidly.

CAD station 66 is used to design laser pattern 68. Different laser patterns for different geometric configurations of coated power device 12 may be designed and stored for easy recall. Laser patterns may be quickly and easily changed allowing for flexibility in handling a variety of electronic power device configurations.

After window 36 is ablated to expose conductive pad 24, solder station 60 solders coated power device 12 to PCB 16 using reflow soldering. Solid solder beads are positioned near plated through hole 30 and exposed conductive pad 24, and then heated until the solder reflows into the through hole 30 and window 36. Since solder does not bind to any area covered with parylene coating 34, the solder 38 only binds to the portion of conductive pad 24 exposed through laser ablation. This allows the precise area of the solder bond to be defined by the shape and size of window 36.

Potting station 62 encloses PCB 16, baseplate 14, and coated power device 12 in a plastic case 40 (FIG. 2). Case 40 is then filled with encapsulant 42 (e.g., silicone resin manufactured by Thermoset Plastics Inc., Indiana; or poly-urea manufactured by Resin Tech Group). Encapsulant 42, in combination with parylene coating 34, protects power device 12 from environmental influences and other mechanical stresses.

Other embodiments are within the scope of the following claims.

Figure 8:
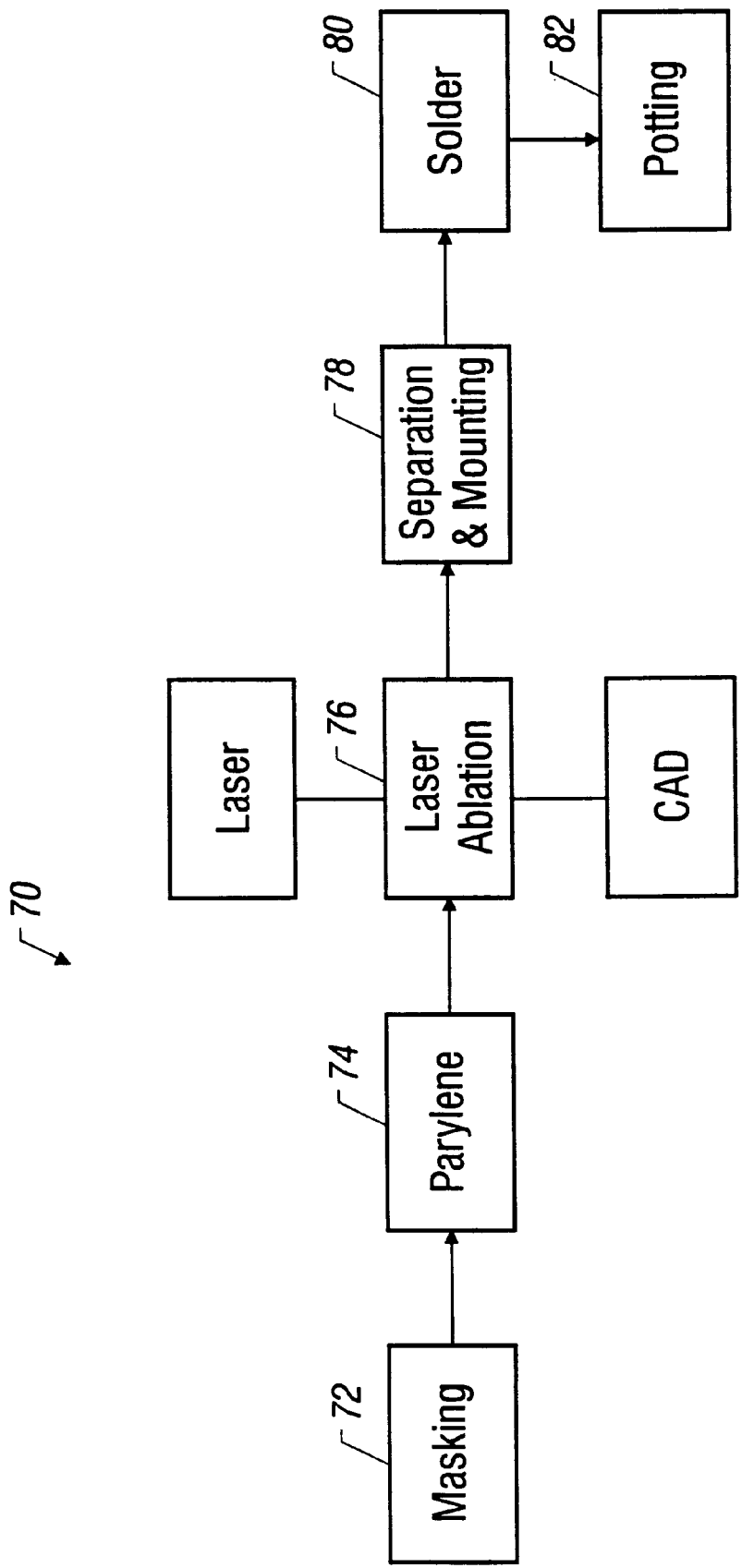
FIG. 8 is a block diagram of another integrated power device packaging line.

For example, referring to FIG. 8, an integrated power device packaging line 70 has a laser ablation station 76 ahead of a separation and mounting station 78. After the masking station 72 and parylene coating station 74, laser ablation station 76 cuts window 36 in the parylene coating 34 while power device 12 is still attached to adhesive sheet 64. This configuration allows windows 36 to be cut in multiple power devices 12 at virtually the same time.

Figure 9:
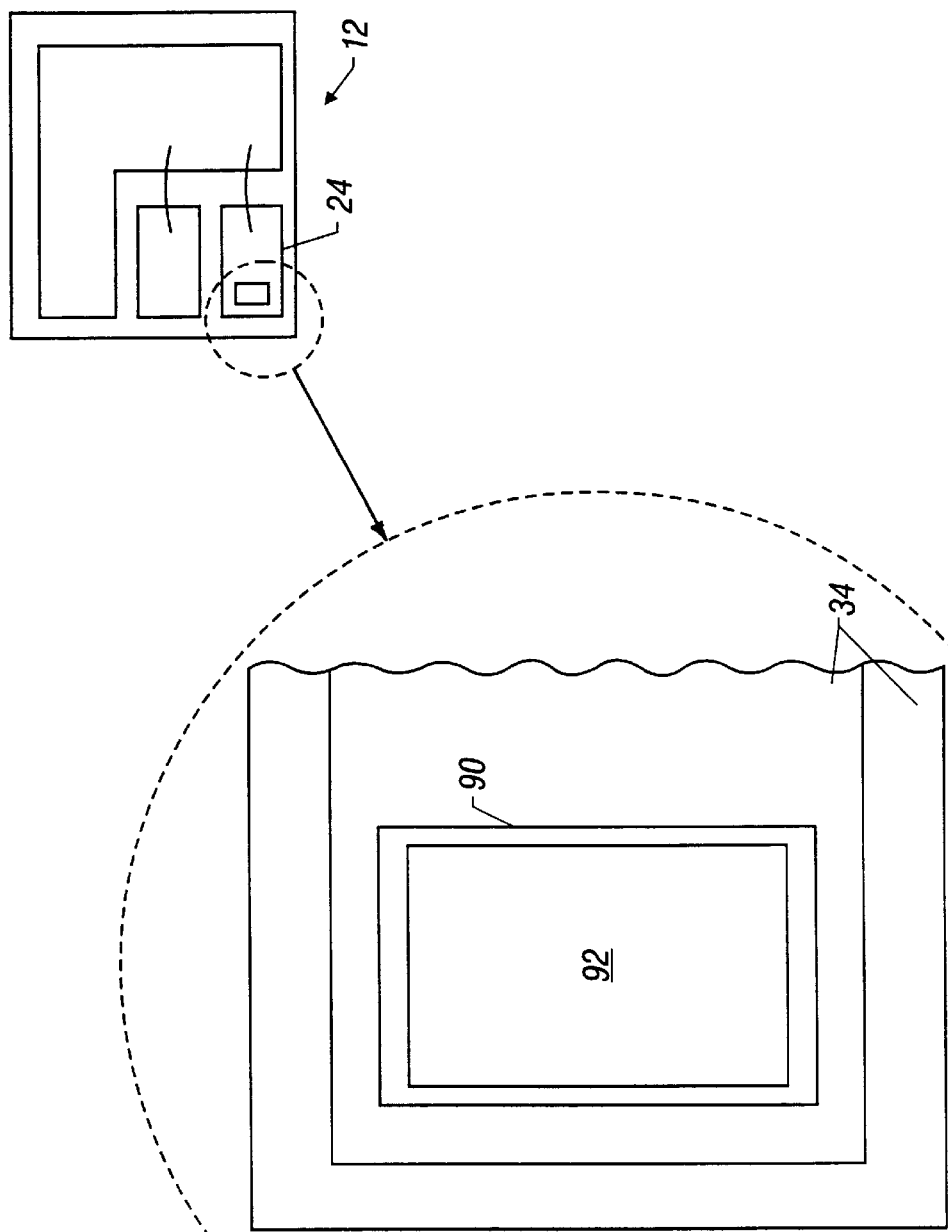
FIG. 9 is a top view of a coated integrated power device with an enlarged view of another laser pattern.

In another embodiment, window 36 in parylene coating 34 is created by laser cutting an outline of the area to be removed, as shown in FIG. 9, and then peeling away the outlined area of the parylene coating. Perimeter cut 90, made by laser 59 (FIG. 5), outlines an area 92 of the parylene coating to be removed. This area 92 is dislodged from conductive pad 24 by passing an inert gas (e.g., Nitrogen) over the surface of the coated power device 12 until area 92 peels away from pad 24. In other implementations, compressed air is employed to dislodge area 92. To facilitate removal of area 92, laser 59 scans the surface of area 92, exciting the parylene molecules and thus decreasing the bond with pad 24. An advantage of using a perimeter cut is that it allows the region of parylene targeted for removal to be laser processed and removed with minimal affects on the adjacent parylene coating outside the perimeter cut window.

Figure 10:
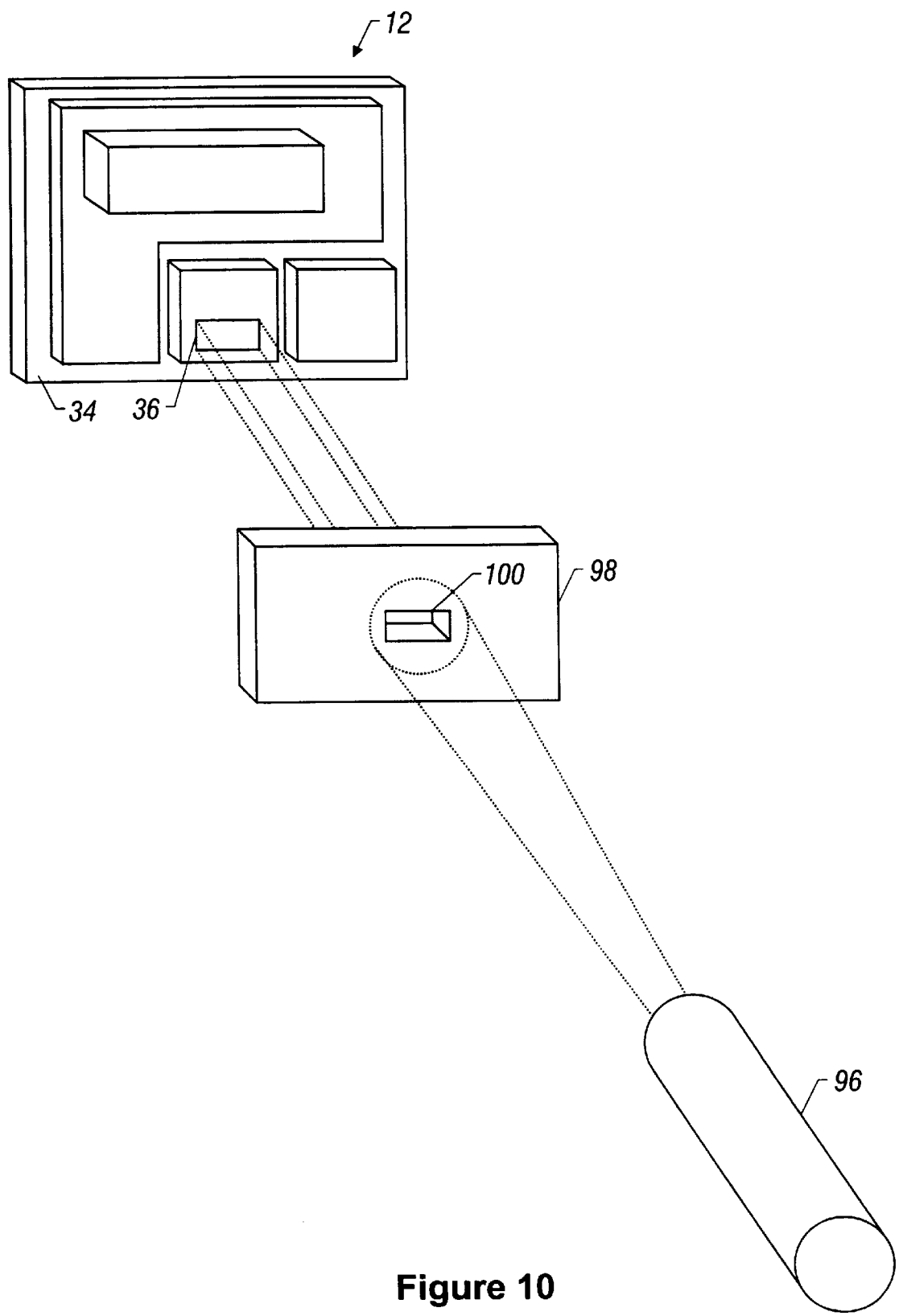
FIG. 10 is a perspective view of a mask marking laser and stencil pattern.

Referring to FIG. 10, in another embodiment, window 36 in parylene coating 34 is created using a mask marking laser 96 (e.g, TEA laser). The laser beam is passed through a stencil 98 with a predetermined pattern 100 before contacting parylene coating 34. Each burst of the laser beam ablates a portion of the parylene coating defined by the stencil pattern 100. Power device 12 is positioned and rotated with respect to the stationary laser 96 and stencil 98.

In another embodiment, window 36 (FIG. 4) is created using a fixed-beam laser. Laser pattern 68 (FIG. 7) is used to ablate parylene coating 34, where the laser beam remains fixed and power device 12 is moved in accordance with pattern 68.

In another embodiment, PCB 16 (FIG. 3) may contain scallops in the edge of aperture 28 instead of through holes 30 (see U.S. Pat. No. 5,644,103, incorporated by reference). A scallop is a concave recess formed in an edge by removing material from the edge. The scallops connect conductive runs on the top surface of the PCB to the bottom surface of the PCB. The conductive run is then electrically connected to a conductive pad on a power device by solder.

Individual electronic devices may be processed instead of arrays of devices.

What is claimed is:

1. A method for making external connections to an electronic device comprising:

forming a protective coating on an exposed surface of the electronic device, the electronic device comprising a substrate, at least one electronic component mounted on the substrate, a conductive termination on the substrate, and an internal connection between the electronic component and the conductive termination;

wherein the step of forming includes forming the protective coating on the conductive termination; and making a window in the protective coating to expose the termination without exposing the electronic component or the internal connection, the window defining an area for making a connection to the termination, the connection passing through the window.

2. The method of claim 1 wherein the coating is uniform in thickness.

3. The method of claim 1 wherein the coating conforms to the geometric configuration of the electronic device.

4. The method of claim 1 wherein coating the electronic device comprises vapor deposition.

5. The method of claim 1 wherein the protective coating comprises a polymer.

6. The method of claim 5 wherein the polymer comprises poly-para-xylylene.

7. The method of claim 1 wherein the electronic device comprises an integrated power device (IPD).

8. The method of claim 1 wherein the electronic component comprises a semiconductor.

9. The method of claim 1 wherein the electronic component comprises a power semiconductor.

10. The method of claim 1 wherein making a window in the protective coating comprises using a laser to remove the protective coating.

11. The method of claim 10 wherein the laser comprises a stroke marking laser.

12. The method of claim 10 wherein the laser comprises a mask marking laser.

13. The method of claim 10 wherein the laser comprises a fixed-beam laser.

14. The method of claim 10 wherein making a window in the protective coating comprises using a predetermined pattern.

15. The method of claim 14 wherein the predetermined pattern comprises a pattern of parallel strokes for removing strips of the protective coating.

16. The method of claim 1 wherein making a window in the protective coating comprises making a perimeter cut with a laser to outline the area of the protective coating to be removed and removing the outlined area of the protective coating.

17. The method of claim 16 wherein removing the outlined area of protective coating comprises peeling the protective coating away from the surface of the electronic device.

18. The method of claim 17 wherein peeling the protective coating comprises passing a gas over the surface of the protective coating until the protective coating dislodges from the electronic device.

19. The method of claim 18 wherein the gas comprises compressed air.

20. The method of claim 18 wherein the gas comprises an inert gas.

21. The method of claim 1 further comprising:

applying solder to the portion of the conductive termination exposed by the window in the protective coating.

22. The method of claim 21 wherein applying solder comprises reflow soldering.

23. The method of claim 21 wherein:

the window restricts the region of the termination to which the solder can adhere, the exposed area defining the location of the solder bond.

24. The method of claim 1 further comprising:

connecting a second component to the termination through the window.

25. The method of claim 23 further comprising encapsulating the electronic device in a potting material.

26. The method of claim 1 further comprising:

establishing an alignment between the window and a respective conductive run on a circuit board, the alignment having the exposed portion of the termination adjacent the respective conductive run;

making a solder connection between the exposed portion of the termination and the conductive run through the window.

27. The method of claim 26 wherein the conductive run further comprises a through hole and the connection comprises a solder connection between the through hole and the exposed portion of the termination.

28. The method of claim 26 wherein the conductive run further comprises a scallop and the connection is made between the scallop and the exposed portion of the termination.

29. The method of claim 26 wherein the circuit board comprises a aperture for accommodating the electronic component, the alignment also having the electronic component in the aperture.

30. The method of claim 4 further comprising:

masking a surface of the electronic device with a removable mask prior to forming the protective coating.

31. The method of claim 30 wherein the masking comprises securing the electronic device to an adhesive sheet.

32. The method of claim 30 further comprising:

mounting the electronic device to a baseplate.

* * * * *

UNITED STATES PATENT AND TRADEMARK OFFICE
CERTIFICATE OF CORRECTION

PATENT NO. : 6,138,349
DATED : October 31, 2000
INVENTOR(S) : Patrizio Vinciarelli and Jeffrey A. Curhan It is certified that error appears in the above-identified patent and that said Letters Patent is hereby corrected as shown below:

<u>Title page,</u>
Item [56], References Cited, U.S. PATENT DOCUMENTS, delete the following references:

| | | |
|---|---|---|
| "4,158,190 | 6/1979 | Stefanov |
| 4,321,589 | 3/1982 | King |
| 4,759,069 | 7/1988 | Bernstein et al. |
| 4,785,474 | 11/1988 | Bernstein et al. |
| 4,956,866 | 9/1990 | Bernstein et al. |
| 5,041,976 | 8/1991 | Marko et al. |
| 5,060,279 | 10/1991 | Crawford et al. |
| 5,193,513 | 3/1993 | Marko et al. |
| 5,235,329 | 8/1993 | Jackson |
| 5,287,411 | 2/1994 | Hill et al. |
| 5,307,060 | 4/1994 | Prevulsky et al. |
| 5,422,543 | 6/1995 | Weinberg |
| 5,483,936 | 1/1996 | Kerstein et al. |
| 5,559,508 | 9/1996 | Orr et al. |
| 5,710,555 | 1/1998 | McConnell et al." | and insert the following references:

| | | |
|---|---|---|
| --5,232,758 | 8/3/93 | Juskey et al. |
| 5,405,808 | 4/11/95 | Rostoker et al. |
| 5,645,673 | 7/8/97 | Fasano et al. |
| 4,800,104 | 1/24/89 | Cruickshank |
| 4,637,862 | 1/20/87 | Eesley et al. |
| 4,784,872 | 11/15/88 | Moeller et al. |
| 5,373,627 | 12/20/94 | Grebe |
| 4,149,302 | 12/20/94 | Cook |
| 5,745,988 | 5/5/98 | Hohmann et al. |
| 5,244,840 | 9/14/93 | Kodai et al. |
| 4,974,317 | 12/4/90 | Rodriguez, II et al. |
| 4,843,036 | 6/27/89 | Schmidt et al. |
| 4,778,641 | 10/18/88 | Chia |
| 4,404,745 | 9/20/83 | Resneau et al. |
| 4,649,418 | 3/10/87 | Uden |
| 4,668,314 | 5/26/87 | Endoh et al. |
| 4,143,456 | 3/13/79 | Inoue |
| 5,735,040 | 4/7/98 | Ochi et al. |
| 4,158,412 | 6/19/79 | Wysocki |
| 5,222,294 | 6/29/93 | Torkington |
| 5,151,389 | 9/29/92 | Zapella |
| 5,051,275 | 9/24/91 | Wong |
| 5,654,225 | 8/5/97 | Zambrano |
| 5,203,078 | 4/20/93 | Nakanishi et al.-- |

UNITED STATES PATENT AND TRADEMARK OFFICE
CERTIFICATE OF CORRECTION

PATENT NO. : 6,138,349
DATED : October 31, 2000
INVENTOR(S) : Patrizio Vinciarelli and Jeffrey A. Curhan It is certified that error appears in the above-identified patent and that said Letters Patent is hereby corrected as shown below:

Title page (cont;d),
OTHER PUBLICATIONS, delete the following references:

"ERI—1 Test Procedure.
The Alarming Sounds of Silence, January 1994, Ergonomics in Design.
Emergency Vehicle Warning Systems, NBS Special Publication 480-37, U.S. Department of Commerce, National Bureau of Standards.
EARS Systems, Inc.
Field Tests of an Automotive Siren/Horn-Detector.
Toward Emergency Vehicle Detection: Systemic Considerations, Harkins, Jensema, & Ryland, Callaudet Research Institute, Wash. D.C."

Column 1,
Line 65, remove period after "window".

Column 2,
Line 34, change "includes" to -- include --.

Column 4,
Line 7, remove a comma after "line".

Column 5,
Line 40, change "affects" to -- effects --.

Column 7,
Line 19, insert -- further -- after "connection".

Column 8,
Line 8, change "a aperture" to -- an aperture --.

Signed and Sealed this

Thirteenth Day of July, 2004

JON W. DUDAS
*Acting Director of the United States Patent and Trademark Office*